(12) United States Patent
Tseng et al.

(10) Patent No.: US 9,177,914 B2
(45) Date of Patent: Nov. 3, 2015

(54) METAL PAD STRUCTURE OVER TSV TO REDUCE SHORTING OF UPPER METAL LAYER

(71) Applicant: Taiwan Semiconductor Manufacturing Company, Ltd., Hsin-Chu (TW)

(72) Inventors: Chung-Chuan Tseng, Hsin Chu (TW); Chia-Wei Liu, Huatan Township (TW); Cindy Kuo, Zhubei (TW); Ren-Wei Xiao, Shetou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 13/678,155

(22) Filed: Nov. 15, 2012

(65) Prior Publication Data

US 2014/0131841 A1    May 15, 2014

(51) Int. Cl.
| | |
|---|---|
| H01L 23/48 | (2006.01) |
| H01L 23/52 | (2006.01) |
| H01L 23/528 | (2006.01) |
| H01L 21/02 | (2006.01) |
| H01L 23/00 | (2006.01) |
| H01L 21/768 | (2006.01) |

(52) U.S. Cl.
CPC ........ *H01L 23/528* (2013.01); *H01L 21/02107* (2013.01); *H01L 23/481* (2013.01); *H01L 21/7684* (2013.01); *H01L 24/05* (2013.01); *H01L 24/13* (2013.01); *H01L 2224/0401* (2013.01); *H01L 2224/05009* (2013.01); *H01L 2224/0557* (2013.01); *H01L 2224/06181* (2013.01); *H01L 2224/13025* (2013.01); *H01L 2224/16145* (2013.01); *H01L 2924/00014* (2013.01); *H01L 2924/1305* (2013.01); *H01L 2924/13091* (2013.01)

(58) Field of Classification Search
CPC .................. H01L 23/481; H01L 21/02107
USPC ....................... 257/774, 773, 786, E23.02
See application file for complete search history.

(56) References Cited

U.S. PATENT DOCUMENTS

| | | | | |
|---|---|---|---|---|
| 5,289,036 A | * | 2/1994 | Nishimoto | 257/774 |
| 5,308,795 A | * | 5/1994 | Hawley et al. | 438/600 |
| 5,502,337 A | * | 3/1996 | Nozaki | 257/773 |
| 6,577,017 B1 | * | 6/2003 | Wong | 257/786 |
| 6,825,541 B2 | * | 11/2004 | Huang et al. | 257/459 |
| 2009/0309242 A1 | * | 12/2009 | Mizuno et al. | 257/786 |
| 2011/0266683 A1 | * | 11/2011 | Feng | 257/773 |

* cited by examiner

*Primary Examiner* — Nitin Parekh
(74) *Attorney, Agent, or Firm* — Slater & Matsil, L.L.P.

(57) ABSTRACT

Various embodiments of mechanisms for forming a slotted metal pad over a TSV in substrate are provided. The dielectric structures in the slotted metal pad reduce dishing effect during planarization of the slotted metal pad. As a result, the risk of having metal stringers in upper metal level(s) caused by the dishing effect is greatly reduced.

20 Claims, 10 Drawing Sheets

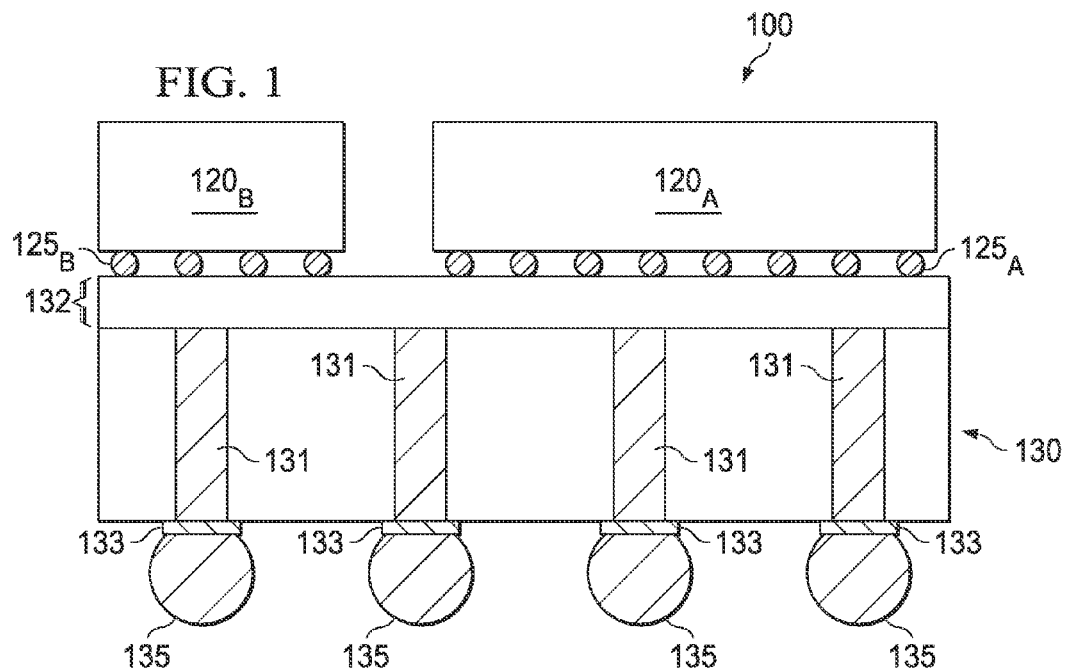
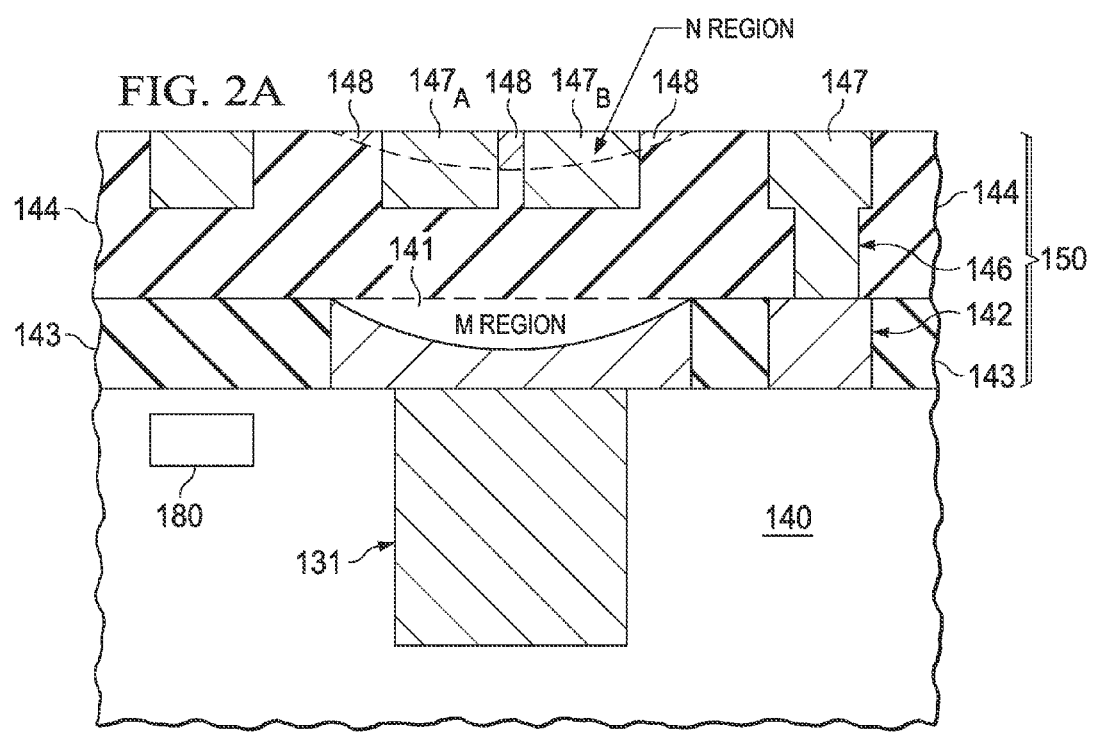

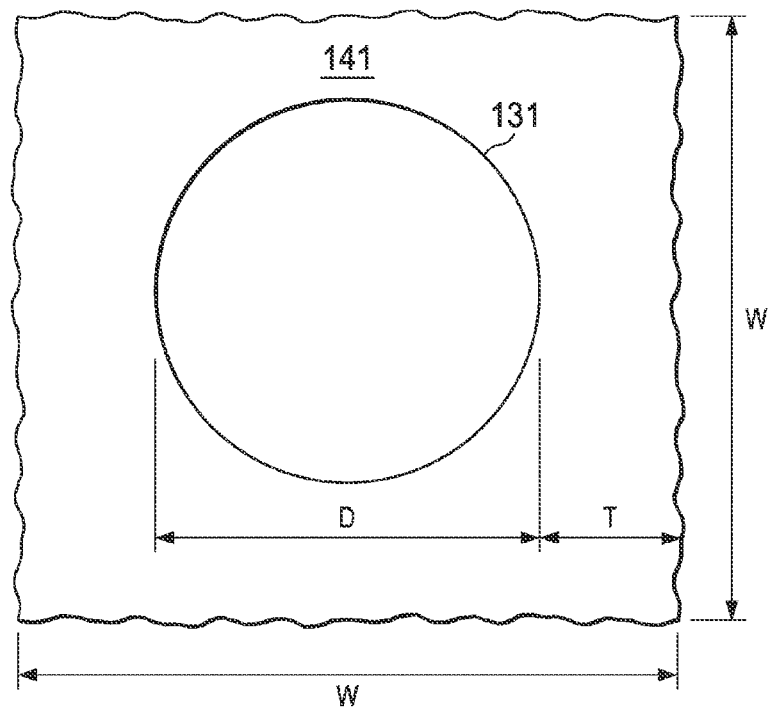
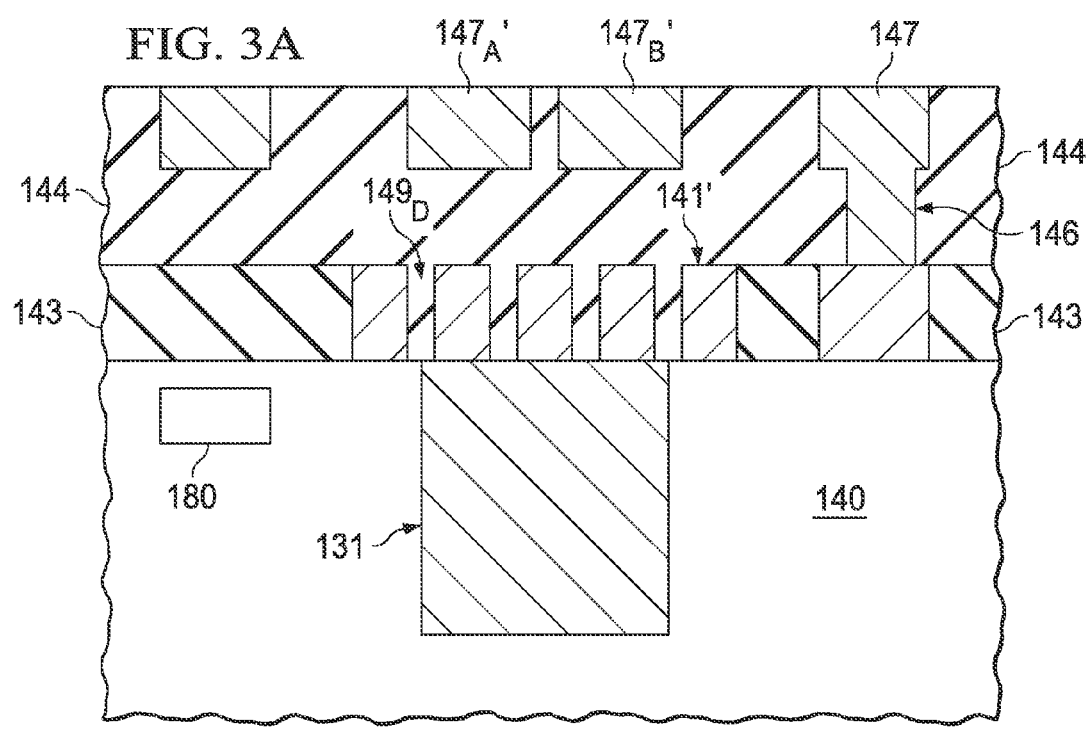

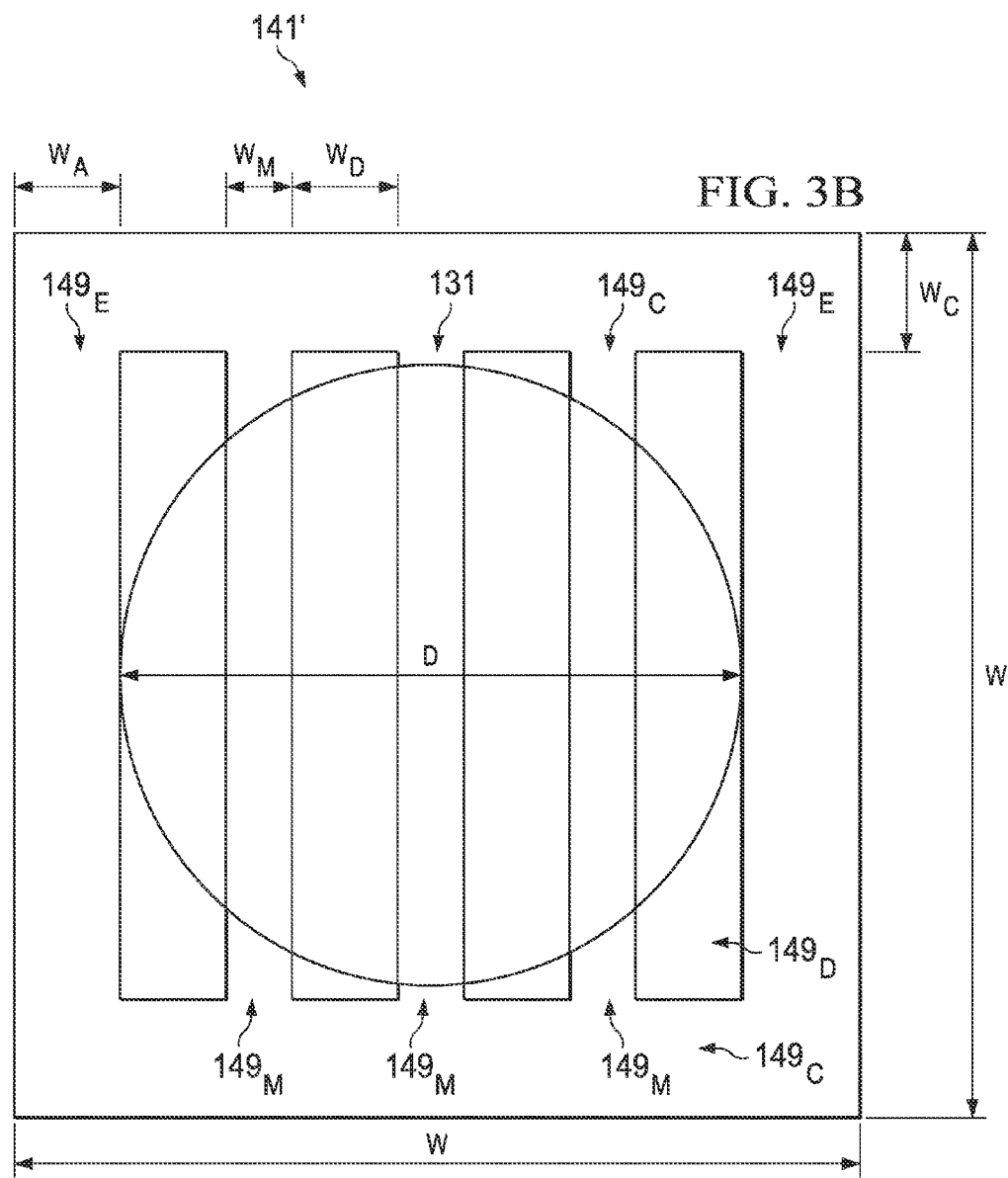

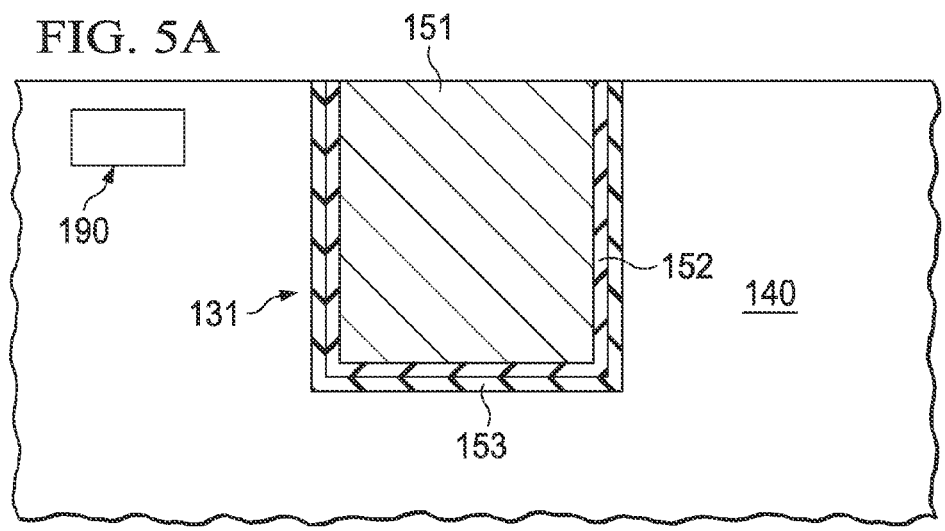
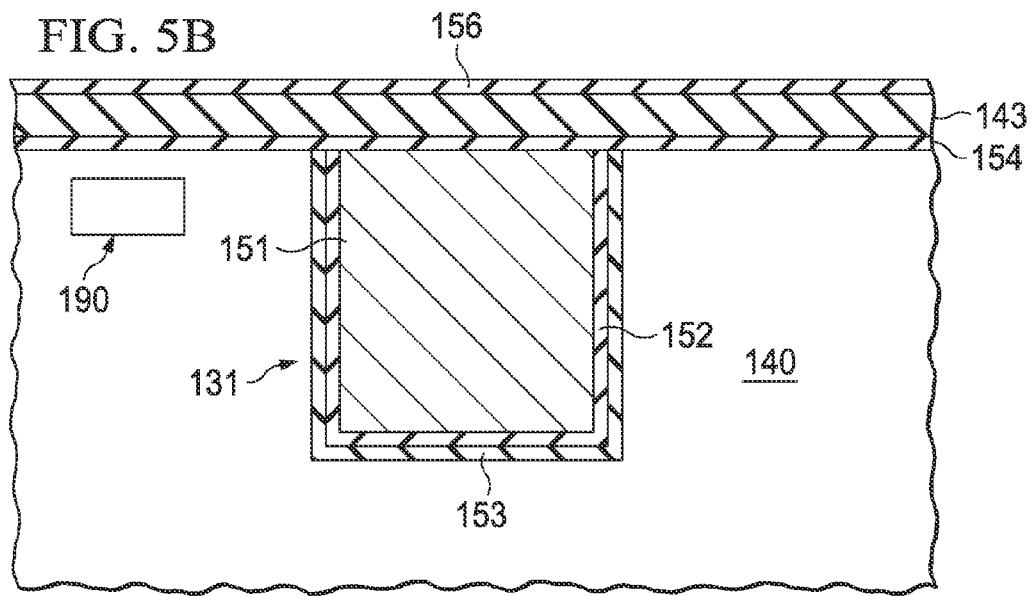

METAL PAD STRUCTURE OVER TSV TO REDUCE SHORTING OF UPPER METAL LAYER

BACKGROUND

With the continued evolution of semiconductor technologies, semiconductor chips/dies are becoming increasingly smaller. In the meantime, more functions are being integrated into the semiconductor dies. Accordingly, the semiconductor dies have increasingly greater numbers of input/output (I/O) pads packed into smaller areas. As a result, the packaging of the semiconductor dies becomes more important and more challenging.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 shows a cross-sectional view of a package, in accordance with some embodiments.

FIG. 2A shows a cross-sectional view of a region near a TSV (through substrate via) of a substrate, in accordance with some embodiment.

FIG. 2B shows a top view of a metal pad over the TSV of FIG. 2A, in accordance with some embodiments.

FIG. 3A shows a cross-sectional view of a region similar to FIG. 2A with a slotted metal pad, in accordance with some embodiment.

FIG. 3B shows a top view of slotted metal pad over a TSV, in accordance with some embodiments.

FIGS. 5A-5H show cross-sectional views of a sequential process flow of forming a slotted metal pad over a TSV and an interconnect structure over the slotted metal pad, in accordance with some embodiments.

DETAILED DESCRIPTION OF ILLUSTRATIVE EMBODIMENTS

Figure 4A:
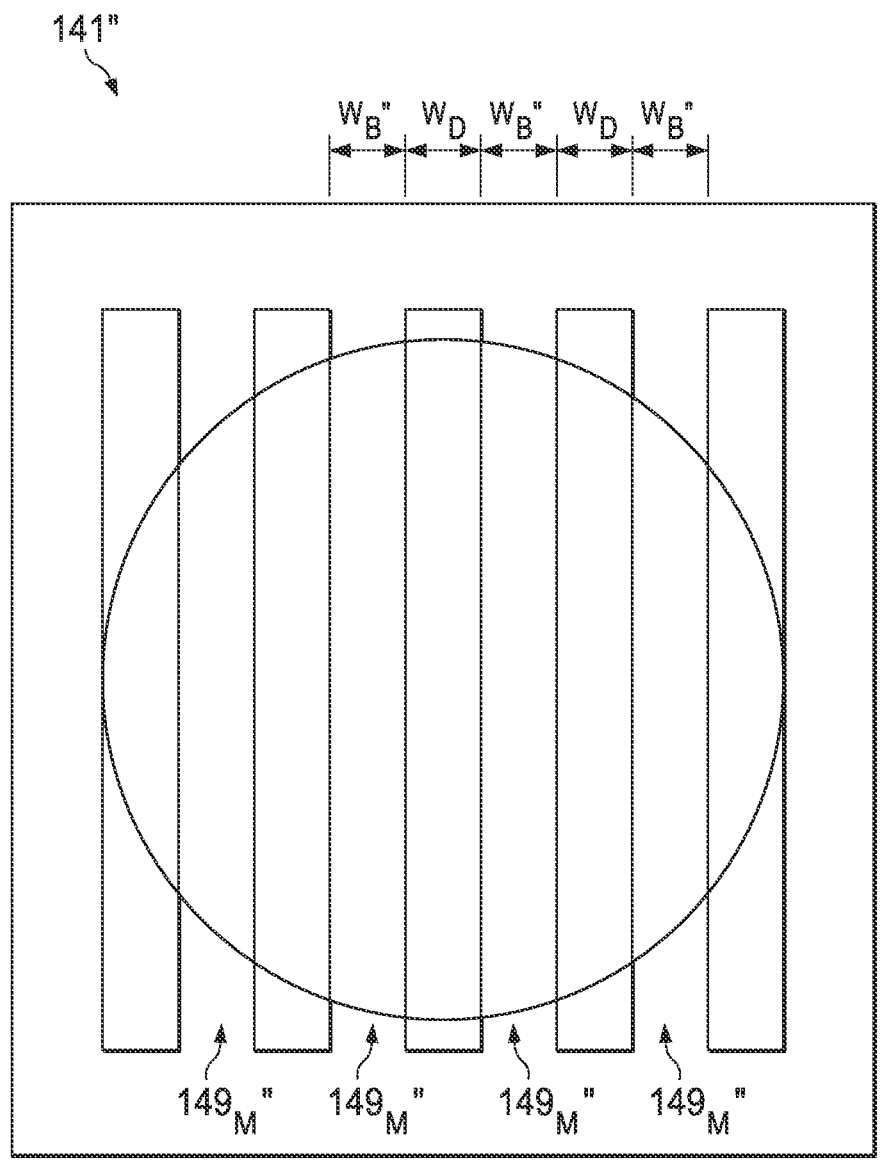
FIGS. 4A-4C show top views of slotted metal pads, in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

Three-dimensional integrated circuits (3D ICs) have been therefore created to resolve the above-discussed limitations. In some formation processes of 3D ICs, two or more wafers, each including an integrated circuit, are formed. The wafers are then bonded with the devices aligned. Through-substrate-vias (TSVs), also referred to as through-silicon-vias or through-wafer vias, are increasingly used as a way of implementing 3D ICs. TSVs are often used in 3D ICs and stacked dies to provide electrical connections and/or to assist in heat dissipation. There are challenges in forming TSVs in 3D ICs and stacked dies.

FIG. 1 shows a cross-sectional view of a package 100, in accordance with some embodiments. Package 100 includes two semiconductor dies, $120_A$ and $120_B$, bonded to another semiconductor die 130. In some embodiments, each of the semiconductor dies, $120_A$ and $120_B$, includes a semiconductor substrate as employed in a semiconductor integrated circuit fabrication, and integrated circuits may be formed therein and/or thereupon. The semiconductor substrate refers to any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The semiconductor substrate may further comprise a plurality of isolation features (not shown), such as shallow trench isolation (STI) features or local oxidation of silicon (LOCOS) features. The isolation features may define and isolate the various microelectronic elements. Examples of the various microelectronic elements (not shown) that may be formed in the semiconductor substrate include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements.

Various processes are performed to form the various microelectronic elements including deposition, etching, implantation, photolithography, annealing, and/or other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Die 130 includes TSVs 131. Die 130 may include various passive and active microelectronic devices (not shown), such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof. Die 130 is an interposer, which provides an electrical connection and/or to assist in heat dissipation in a 3-dimensional (3-D) package system, in accordance with some embodiments. Interposers with active devices may be referred to as active interposers. Interposers without active devices may be referred to as passive interposers.

Die 130 in FIG. 1 also includes interconnect structure 132. Interconnect structure 132, which facilitate electrical connections of dies $120_A$ and $120_B$ with TSVs 131 and passive and/or actives devices (if available) on die 130. Interconnect structure 132 includes conductive structures and dielectric layer(s), which protects and isolates the conductive structures. Dies $120_A$ and $120_B$ are bonded to interconnect structure 132 of die 130 via bonding structures $125_A$ and $125_B$ to make connections with TSVs 131. Die 130 has contact structures 133 on the opposite side die 130 from interconnect structure 132 to bond with external connectors 135.

FIG. 2A shows a cross-sectional view of a region near a TSV 131 of a substrate 140 of semiconductor die 130, in accordance with some embodiment. FIG. 2A shows a device structure 180 has been formed on the first substrate 100. The device structure can be one of the passive and active microelectronic devices described above.

A metal layer 142 is formed over TSV 131 and a metal pad 141 is formed above TSV 131. Metal pad 141 is wider than TSV 131 to ensure complete coverage of the top surface of TSV 131, in some embodiments. While not limiting to the scope of the invention, it is believed that the wider metal pad reduces the likelihood of a pop-up defect occurring with TSV 131. FIG. 2B shows a top view of metal pad 141 over TSV 131, in accordance with some embodiments. FIG. 2B shows the top surface of TSV 131 being circular with a diameter D. Metal pad 141 is square with a width W. W is greater than D. (W-D)/2 is greater than alignment tolerance T. In some embodiments, D is in a range from about 3 μm to about 30 μm. In some embodiments, W is in a range from about 10 μm to about 50 μm. In some embodiment, T is in a range from about 0 μm to about 10 μm. Metal lines (not shown) are on the same level as metal layer 142 are connected to metal pad 141 to allow electrical connections between various devices and structures with TSV 131 through metal pad 141.

To form the metal layer 142, openings, such as the opening for forming metal pad 141, are formed in dielectric layer 143 first. The openings are then filled the conductive materials, which may include a barrier or adhesion layer and a main conductive material for metal layer 142. The barrier or adhesion layer and the main conductive material are not only deposited in the openings, but are also deposited on the surface of dielectric layer 143. A planarization process, such as a chemical-mechanical polishing (CMP) process, is used to remove excess conductive material(s) outside the openings. Due to the relative large width of metal pad 141, the CMP process causes dishing effect, which results in recess (or dipping) of the surface of metal pad 141 near the center of the metal pad 141 to be below edges of the metal pad 141, as shown in region M of FIG. 2A in accordance with some embodiments.

The recess of the metal pad 141 would affect the planarization of upper layers. After the CMP process is completed, a dielectric layer 144 is deposited on the surface of substrate 140. The recess near the center of metal pad 141 is transferred to the dielectric layer 144 above the metal pad 141, as shown in region N of FIG. 2A, in accordance with some embodiments. After the dielectric layer 144 is deposited, substrate 140 is patterned to form openings of via plugs 146 and metal lines 147. Such openings are then filled by a conductive material(s) 145 similar to the metal layer 142 described above, in accordance with some embodiments. The excess conductive material(s) outside metal lines 147 is then removed. Due to the recess in the dielectric layer 144, metal stringers are left on the surface. Such metal stringers would cause unwanted shorting between metal lines 147. As shown in FIG. 2A, metal stringers 148 in region N would result in shorting between two neighboring metal lines 147A and 147B.

Via plugs, metal lines 147, and dielectric layer 144 form an interconnect structure 150 over slotted metal pad(s) 141. Additional interconnect structure(s) (not shown) can be formed above interconnect structure 150. Bonding structures can be formed over the interconnect structures, including interconnect structure 150, described above to bond to dies $120_A$ and $120_B$. Interconnect structure 150 is part of interconnect structure 132 of FIG. 1, in accordance with some embodiments. In some embodiments, the interconnect structure 150 is called a redistribution structure, which helps redistribute connections across die 130 to facilitate connection to external contacts. In some embodiments, metal lines 147 include metal pads (not shown) for forming bump structures to bond with external connectors. The bump structures and the external connectors form bonding structures $125_A$ and $125_B$ described above.

Examples of redistribution structures and bonding structures, and methods of forming them are described in U.S. application Ser. No. 13/427,753, entitled "Bump Structures for Multi-Chip Packaging," filed on Mar. 22, 2012 (Attorney Docket No. TSMC2011-1339), and U.S. application Ser. No. 13/338,820, entitled "Packaged Semiconductor Device and Method of Packaging the Semiconductor Device," filed on Dec. 28, 2011 (Attorney Docket No. TSMC2011-1368). Both above-mentioned applications are incorporated herein by reference in their entireties.

FIG. 3A shows a cross-sectional view of a region similar to FIG. 2A with a slotted metal pad 141', in accordance with some embodiments. Slotted metal pad 141' has openings filled with dielectric material of dielectric layer 143 to form dielectric bars $149_D$ embedded in the slotted metal pad 141'. These dielectric bars act as polish stop and reduce the dishing effect of CMP process used to form metal pad 141'. FIG. 3A shows that with the usage of the dielectric bars, the dishing of slotted metal pad 141' is reduced to none or almost none. As a result, the metal stringer 148 between metal lines $147_A'$ and $147_B'$ is completely removed and there is no risk of shorting between metal lines $147_A'$ and $147_B'$.

FIG. 3B shows a top view of slotted metal pad 141' over TSV 131, in accordance with some embodiments. The slotted metal pad 141' has a width of W and is a square metal pad. The width of the TSV 131 is D. Some embodiments of ranges of W and D have been described. The metal area of slotted metal pad 141' is $A_M$ and the dielectric area is $A_D$. The total top area of the slotted metal pad 141' ($A_M+A_D$) is A. The ratio of metal area $A_M$ to total area A ($A_M/A$) should not be too low to ensure sufficient contact between slotted metal pad 141' with TSV 131 and also to ensure the resistivity of the metal pad 141' is not too high to affect device performance. On the other hand, the ratio of metal area $A_M$ to total area A ($A_M/A$) needs to be limited to prevent dishing effect. In some embodiments, the $A_M/A$ ratio is in a range from about 50% to about 90%.

The slotted metal pad 141' is shaped in square in the embodiments shown in FIG. 3B. The width of metal pad 141' is W and the diameter of TSV is D. The top surface area of TSV is $A_T$, which is equal to $D^2\pi/4$. The ratio of total area A, which is equal to $W^2$, to top surface area of TSV $A_T$ ($A/A_T$) should not be too low to ensure sufficient good coverage of slotted metal pad 141' over TSV with alignment variation taken into consideration. On the other hand, the ratio of total area A to TSV area $A_T$ ($A/A_T$) needs to be limited to prevent the slotted metal pad 141' from occupying too much area on the die. In some embodiments, the $A/A_T$ ratio is in a range from about 1.2 (T=0) to about 3.5.

FIG. 3B shows the metal bar $149_E$ of metal pad 141' are wider than metal bars $149_M$, in accordance with some embodiments. Metal bars $149_E$ are at the edges of slotted metal pad 141' and are also next to broad area of dielectric layer 143. At a result, metal bars $149_E$ are at a lower risk of suffering from dishing effect, in comparison to metal bars $149_M$ between metal bars $149_E$. Metal bars $149_C$, which are connected to metal bars $149_E$ and $149_M$, are also at the edges of slotted metal pad 141'. However, since they are connected to metal bars $149_M$, their susceptibility to dishing effect is more than metal bars $149_E$ and less than metal bars $149_M$, in accordance with some embodiments. The susceptibility of dish effect of metal bars $149_M$, which are away from edges of slotted metal pads 141' depends on the ratio of width $W_m$ of metal bars $149_M$ to the width $W_D$ of dielectric bars $143_D$ between metal bars $149_M$ ($W_M/W_D$). The higher the $W_M/W_D$ ratio, the more susceptible the slotted metal pad 141' is to dishing effect during CMP. In some embodiments, $W_M/W_D$ is in a range from about 0.5 to about 1.2. The $W_M/W_D$ ratio is also affected by the CMP process and the material used for dielectric layer 143. Process conditions, including the polishing pad used and CMP slurry used, and the resistance of the material used for dielectric layer 143 could affect the applicable range of $W_M/W_D$ for the slotted metal pad 141'. As mentioned above, the ratio of metal area $A_M$ to total area A of slotted metal pad 141' ($A_M/A$) cannot be too low to prevent the resistance of the slotted metal pad from being too high. Therefore, $W_M/W_D$, which is related to $A_M/A$, cannot be too low. In some embodiments, $W_M/W_D$ is in a range from about 0.8 to about 1.0.

In some embodiments, W, the overall width of slotted metal pad 141', is in a range from about 11 μm to about 34 μm. In some embodiment $W_A$, the overall width of slotted metal pad 141', is in a range from about 0.4 μm to about 4 μm. In some embodiment $W_M$ is greater than about 0.4 μm. In some embodiment $W_C$ is in a range from about 0.4 μm to about 4 μm. In some embodiment $W_D$ is greater than about 0.4 μm. In some embodiments, $W_D$ is greater than about 0.4 μm. The lower limits of $W_A$, $W_M$, $W_C$, and $W_D$ are set according to certain technology node. They may be larger or smaller for different technology nodes.

The slotted metal pads 141' described above are only examples. Other designs of slotted metal pad may also be used. FIG. 4A shows a top view of a slotted metal pad 141" in accordance with some embodiments. The slotted metal pad 141" has a narrower width $W_M$" of metal bar(s) near the center of slotted metal pad 141". Center region of slotted metal pad 141" has higher risk of dishing than the edges. The ratio of width $W_M$" of metal bar(s) to width $W_D$ of dielectric bars can be kept lower than those closer to edges to reduce to risk of dishing.

Figure 4B:
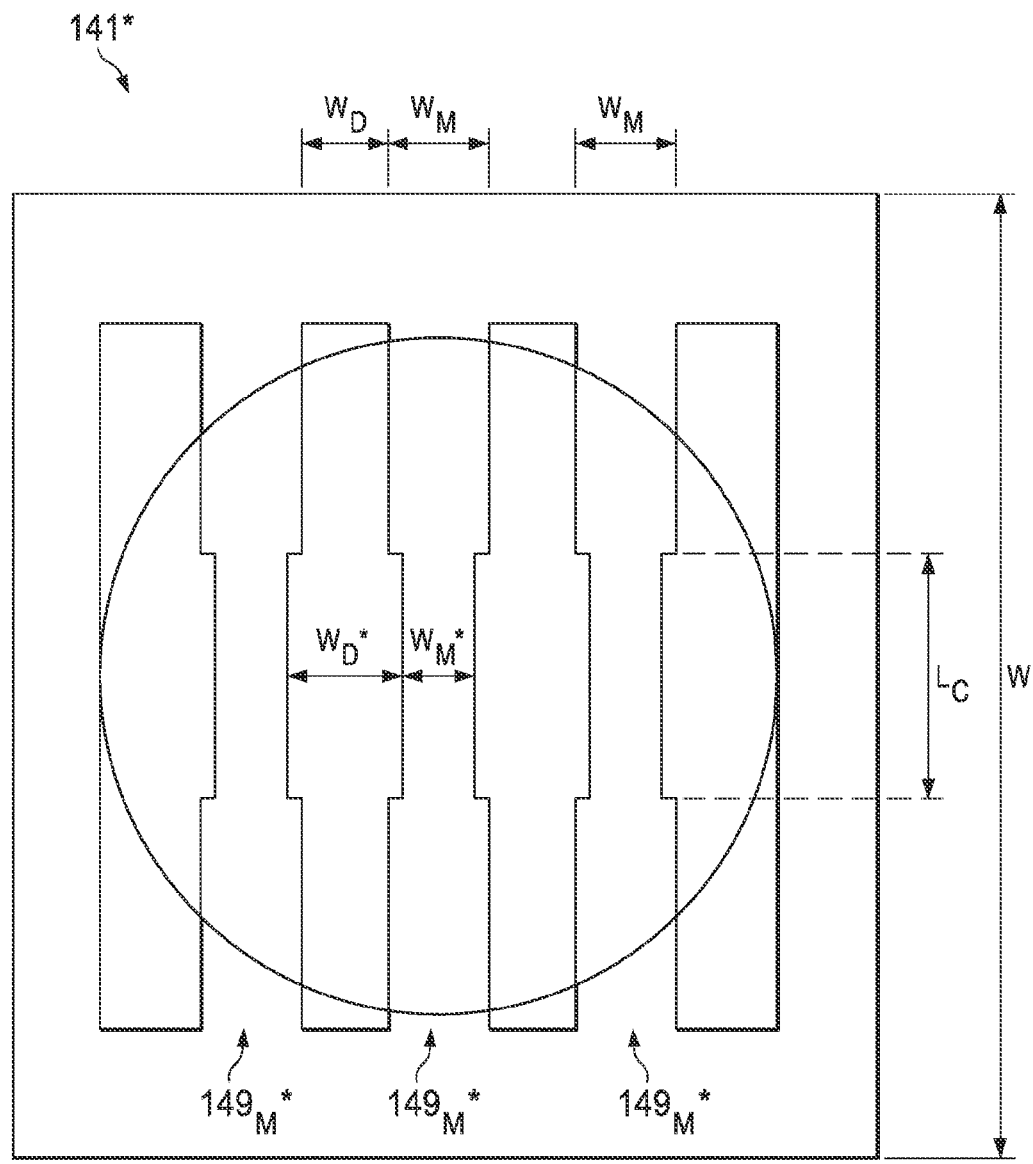

FIG. 4B shows a top view of a slotted metal pad 141* in accordance with some embodiments. The slotted metal pad 141* has a narrower width $W_M$* of metal bars and wider dielectric bars (width $W_D$*) near the center of slotted metal pad 141*. Center region of slotted metal pad 141* has higher risk of dishing than the edges. By having narrower metal bars and wider dielectric bars near the center of slotted metal pad 141*, the risk of dishing is reduced and the width of $W_M$ can be wider. In some embodiments, the ratio of $W_M$*/$W_D$* is in a range from about 0.5 to about 0.95. The width of the dielectric bar $W_D$* compensates for the narrower metal bar WB*, in accordance with some embodiments. The narrower metal bars near the center of slotted metal pad 141* have a length of $L_C$, as shown in FIG. 4B. In some embodiments, the ratio of $L_C$/W is in a range from about 0.2 to about 0.8.

Figure 4C:
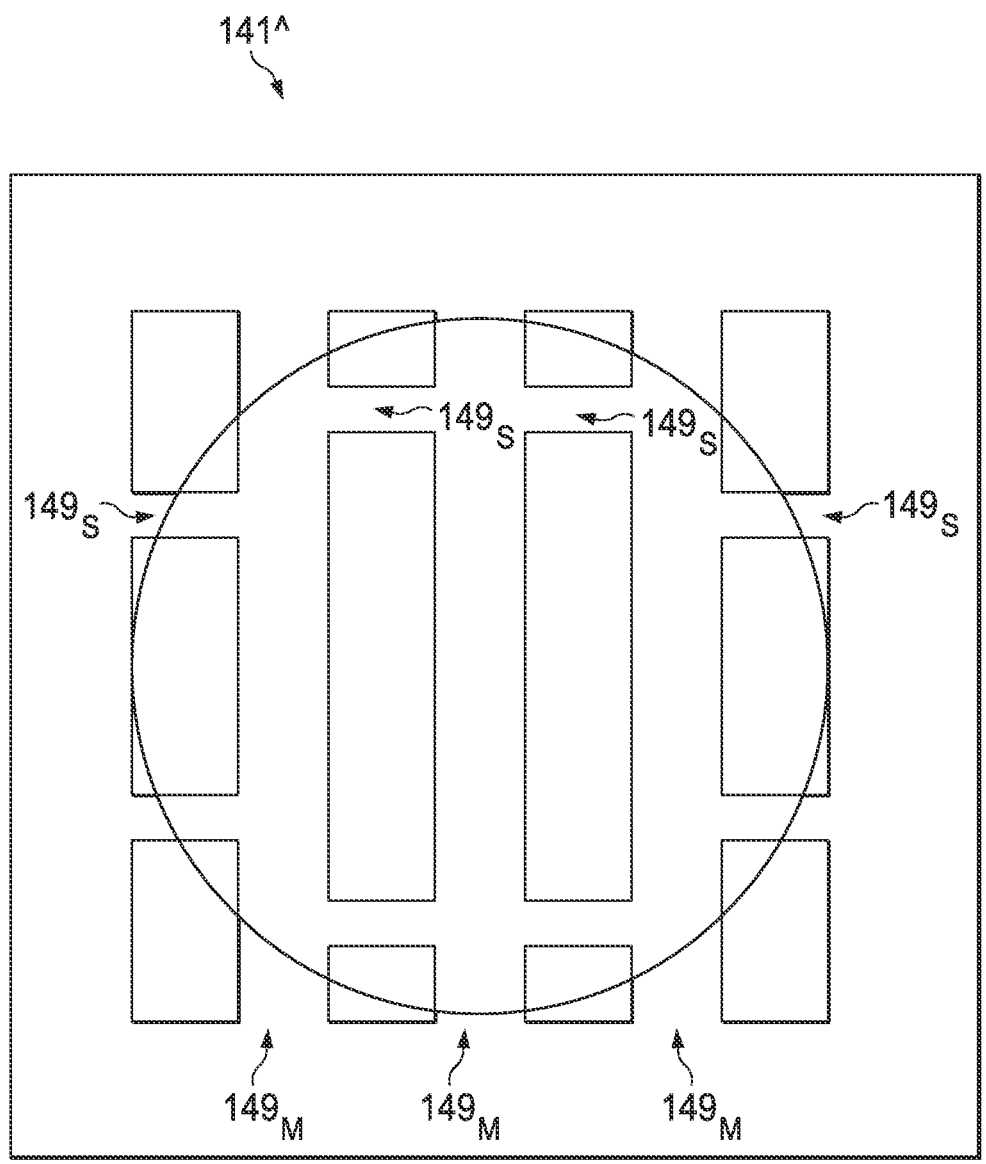

In addition to the patterns described above, other patterns of slotted metal pads are also possible. FIG. 4C shows a top view of a slotted metal pad 141Ô in accordance with some embodiments. FIG. 4C shows that pairs of neighboring metal bars 143^ are connected by some metal strips $149_S$ near the edges of slotted metal pad 141Ô. However, the neighboring metal bars near the center of slotted metal pad 141Ô are not connected by metal strips $143_S$. The connecting metal strips $149_S$ can reduce the resistance of slotted metal pad 141Ô. Other pattern designs are possible, as long as the metal pad designs reduce CMP dishing effect.

Figure 5C:
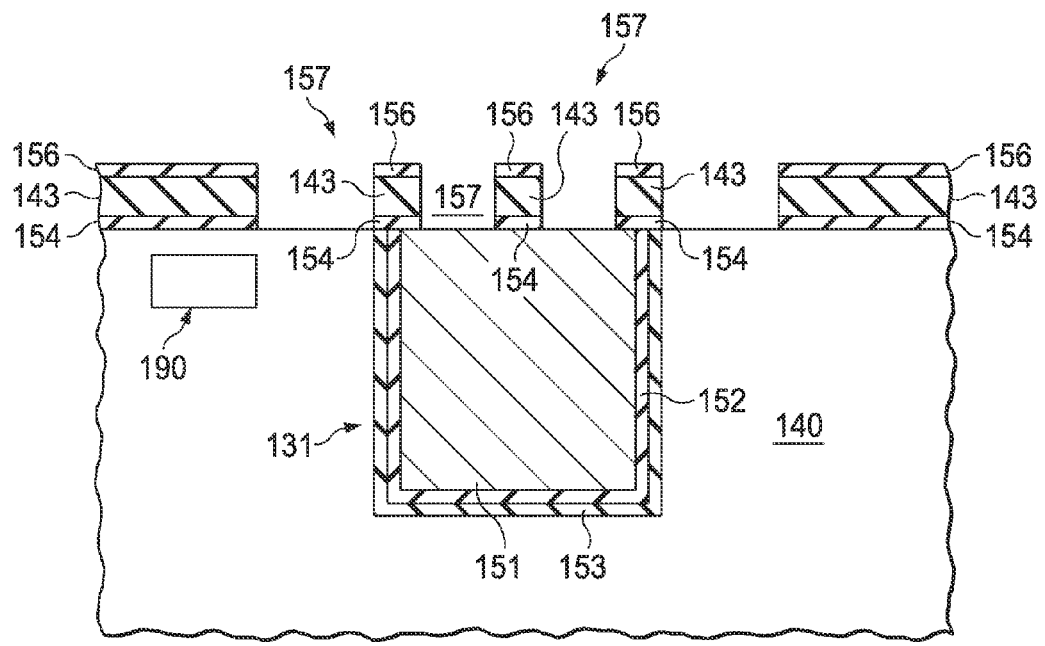

FIGS. 5A-5H show cross-sectional view of a sequential process flow of forming slotted metal pad 141' over TSV 131 and an interconnect structure 150 over the slotted metal pad 141', in accordance with some embodiments. FIG. 5A shows a substrate 140 wherein a TSV 131 is provided. TSV 131 includes a conductive layer 151. In some embodiments, conductive layer 151 is made of copper or a copper alloy. The conductive layer 151 is surrounded by a diffusion barrier layer 152 to prevent copper from diffusing into substrate 140 to affect device performance. In some embodiments, the diffusion barrier layer 152 is made of TaN. The thickness of the diffusion barrier layer is in a range from about 0.5 μm to about 1.5 μm, in some embodiments. The diffusion barrier layer 152 is surrounded by a dielectric layer 153, which insulates TSV 131 from substrate 40. In some embodiments, the dielectric layer 153 is made of SiO2. In some embodiments, the dielectric layer 153 has a thickness in a range from about 0.5 μm to about 1.5 μm, in accordance with some embodiments. A device structure 180 has been formed on substrate 140.

FIG. 5B shows that an etch stop layer 154, a dielectric layer 143, and a planarization stop layer 156 are sequentially deposited on the substrate of FIG. 5A in accordance with some embodiments. The etch stop layer 154 is made of SiN with a thickness in a range from about 40 nm to about 60 nm, in some embodiments. The dielectric layer 143 may be made of applicable materials, such as $SiO_2$, or a low dielectric constant (low-k) dielectric material. In some embodiments, the k value of the low-k dielectric material is less than 3.5. In some embodiments, the k value of the low-k dielectric material is less than 2.5. The thickness of the dielectric layer 143 is in a range from about 0.8 μm to about 1 μm, in some embodiments. The planarization stop layer 156 is made of SiON with a thickness in a range from about 50 nm to about 70 nm, in some embodiments.

Figure 5D:
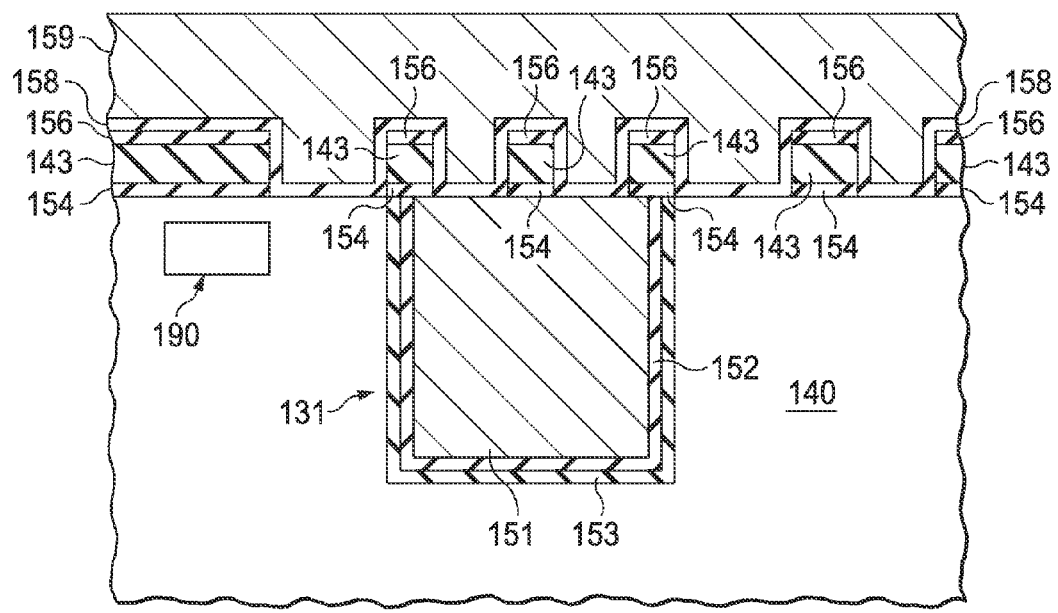

After the dielectric layers 154, 143, and 156 are sequentially deposited on substrate 140, the layers are patterned to form openings 157 for subsequently formed slotted metal pad 141', as shown in FIG. 5C in accordance with some embodiments. The patterning process involves lithography and etching processes. The etch stop layer 154 is used to control the end point of the etching process. Openings 157 are to be filled with conductive material(s) to form slotted metal pad 141'. A diffusion barrier layer 158 is first deposited to line openings 157, as shown in FIG. 5D in accordance with some embodiments. The diffusion barrier layer 158 is made of TaN with a thickness in a range from about 2 nm to about 10 nm, in some embodiments. A thin seed layer (not shown) is deposited over the diffusion barrier layer 158 to be a seed layer for plating of a conductive layer 159 used to fill the openings 157, in accordance with some embodiments. Afterwards, conductive layer 159 is deposited for fill openings 157. The conductive layer 159 is made of copper or copper alloy, in some embodiments. The conductive layer 159 is formed by a plating process and the seed layer is copper seed layer, in some embodiments. Since the seed layer and the conductive layer 159 is made of the same material, they are merged into one material. As a result, the seed layer is not shown in FIG. 5D. In some embodiments, the thin seed layer has a thickness in a range from about 0.1 μm to about 0.2 μm, in some embodiments. Sufficient thickness of conductive layer 159 is deposited to gapfill openings 157.

Figure 5E:
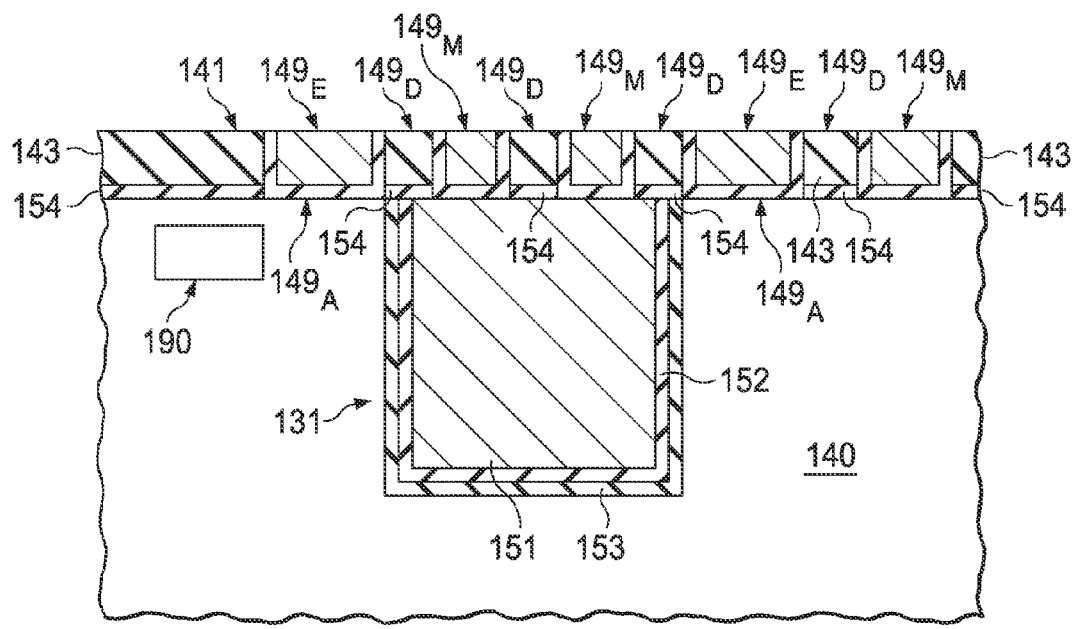

Following the deposition of conductive layer 159, a planarization process is used to remove excess conductive layer 159 and diffusion barrier layer 158 outside openings 157. In some embodiments, the planarization process is a chemical-mechanical polishing (CMP) process. The planarization stop layer 156 is used as a polishing stop. The residual planarization stop layer 156 is also removed after the CMP process, such as by an etching process. FIG. 5E shows substrate 140 after the planarization process is completed, in accordance with some embodiments. The slotted metal pad 141' is formed. With the dielectric bars 149$_D$ between metal bars 149$_E$ and 149$_M$, the slotted metal pad 141' does not suffer from significant dishing effect.

Figure 5F:
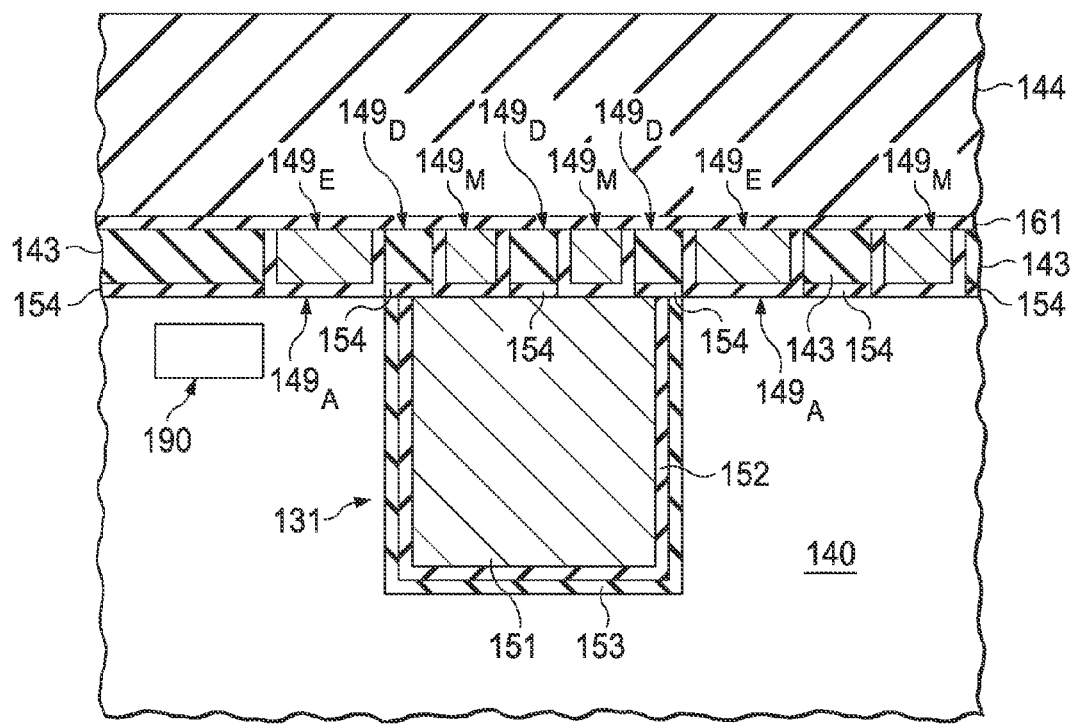

Following the planarization process, substrate 140 undergoes additional processing sequence to form interconnect structure 150. An etch stop layer 161 is deposited on the surface of substrate 141', as shown in FIG. 5F in accordance with some embodiments. Afterwards, dielectric layer 144 is formed over the etch stop layer 161. The etch stop layer 161 is made of SiC with a thickness in a range from about 50 nm to about 60 nm, in some embodiments. The dielectric layer 144 may be made of applicable materials, such as $SiO_2$, or a low dielectric constant (low-k) dielectric material. In some embodiments, the k value of the low-k dielectric material is less than 3.5. In some embodiments, the k value of the low-k dielectric material is less than 2.5. The thickness of the dielectric layer 144 is in a range from about 0.6 µm to about 0.7 µm, in some embodiments.

Figure 5G:
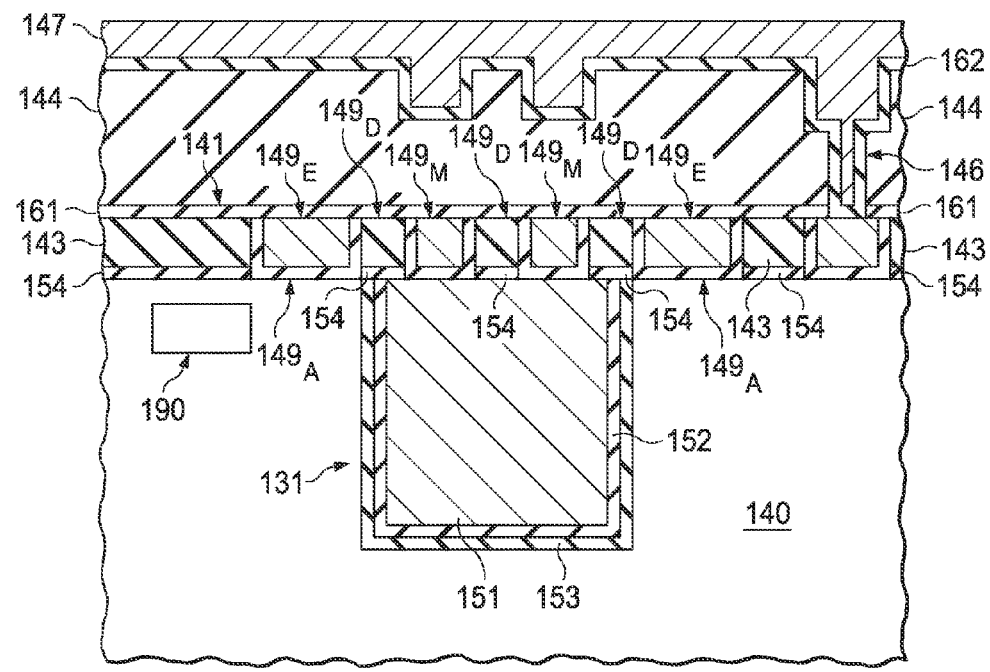
Figure 5H:
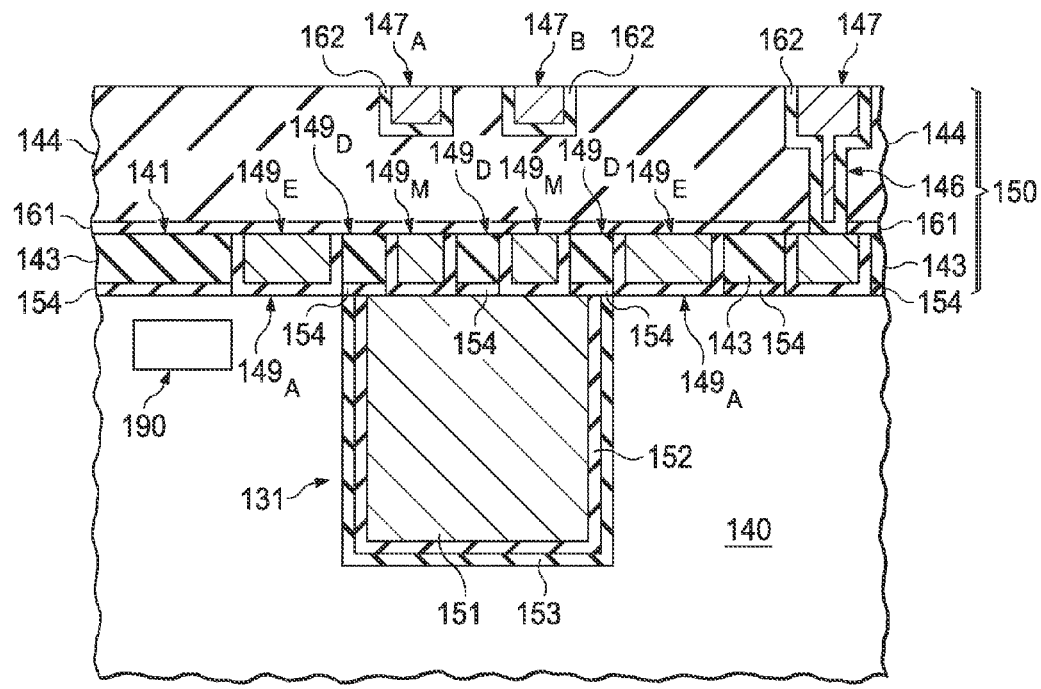

Following the deposition of etch stop layer 161 and dielectric layer 144, substrate 140 is patterned and etched to form openings of via plugs and metal lines. The openings of via plugs and metal lines are then deposited with a diffusion barrier layer 162 and then filled with a conductive layer 147, as shown in FIG. 5G in accordance with some embodiments. In some embodiments, the materials and mechanisms of forming the diffusion barrier layer 162 and conductive layer 147 are similar to those of diffusion barrier layer 158 and conductive layer 159 respectively. Afterwards, the excess conductive layer 147 and diffusion barrier layer 158 outside openings of meta lines are removed and the interconnect structure 150 over the slotted metal pad 141' is formed, as shown in FIG. 5H in accordance with some embodiments.

Various embodiments of mechanisms for forming a slotted metal pad over a TSV in substrate are provided. The dielectric structures in the slotted metal pad reduce dishing effect during planarization of the slotted metal pad. As a result, the risk of having metal stringers in upper metal level(s) caused by the dishing effect is greatly reduced.

In some embodiments, a semiconductor die for bonding with another die is provided. The semiconductor die includes a through substrate via (TSV) formed in a substrate of the semiconductor die, and a slotted metal pad formed directly over the TSV. The slotted metal pad has a top surface area larger than a top surface area of the TSV, and the slotted metal pad has a plurality of metal bars in a first direction. Slots between the plurality of metal bars are filled with a dielectric material to form dielectric bars.

In some embodiments, a semiconductor die is provided. The semiconductor die includes a through substrate via (TSV) formed in a substrate of the semiconductor die. The semiconductor die also includes a slotted metal pad formed directly over the TSV, and the slotted metal pad has a top surface area larger than a top surface area of the TSV. The slotted metal pad has a plurality of metal bars in a first direction, and slots between the plurality of metal bars are filled with a dielectric material to form dielectric bars. A first metal bar of the plurality of metal bars at an edge of the slotted metal pad is wider than a second metal bar of the plurality of metal bars away from edges of the slotted metal pad.

In yet some other embodiments, a method of forming interconnect structures over a through substrate via (TSV) on a substrate is provided. The method includes providing the substrate with the TSV, and forming a dielectric layer over the TSV. The method also includes forming openings in the dielectric layer, and the openings are connected. There are dielectric structures of the dielectric layer amongst openings. The method further includes depositing a diffusion barrier layer to line the openings, and depositing a conductive layer to gap-fill the openings. In addition, the method includes planarizing the conductive layer and the diffusion barrier layer to remove the conductive layer and the diffusion barrier layer outside the openings to form a slotted metal pad. The planarization operation does not cause significant dishing effect near a center of the slotted metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor die for bonding with another die, comprising:
   a through substrate via (TSV) formed in a substrate of the semiconductor die; and
   a slotted metal pad formed directly over the TSV, wherein the slotted metal pad has a top surface area larger than a top surface area of the TSV, wherein the slotted metal pad has a plurality of metal bars in a first direction, and wherein slots between the plurality of metal bars are filled with a dielectric material to form dielectric bars.

2. The die of claim 1, wherein a first metal bar of the plurality of metal bars located at an edge of the slotted metal pad is wider than a second metal bar of the plurality of metal bars located away from the edge of the slotted metal pad.

3. The die of claim 2, wherein the second metal bar has a middle section and an edge section, the edge section being closer to the edge of the slotted metal pad than the middle section, the middle section being narrower, in a direction perpendicular to the first direction, than the edge section.

4. The die of claim 3, wherein the middle section has a length, the slotted metal pad has a width, and wherein the length of the middle section relative the width of the slotted metal pad is in a range from about 0.2 to about 0.8.

5. The die of claim 2, wherein a ratio of a width of the second metal bar to a width of a neighboring dielectric bar is in a range from about 0.5 to about 1.2.

6. The die of claim 2, wherein a fourth metal bar near a center of the slotted metal pad is narrower than the second metal bar.

7. The die of claim 2, wherein the second metal bar has a width greater than about 0.4 µm.

8. The die of claim 1, wherein a third metal bar in a second direction perpendicular to the first direction connects to the plurality of metal bars.

9. The die of claim 1, wherein the plurality of metal bars include a copper diffusion barrier layer and a copper-containing gap-fill layer.

10. The die of claim 1, wherein a ratio of metal surface area of a surface of the slotted metal pad facing the TSV to a total surface area of the surface of the slotted metal pad facing the TSV is in a range from about 50% to about 90%.

11. The die of claim 1, wherein a ratio of a total surface of the slotted metal pad facing the TSV to a top surface of the TSV in contact with the slotted metal pad is in a range from about 1.2 to about 3.5.

12. The die of claim 1, further comprising additional metal strips connecting neighboring metal bars of the plurality of metal bars, wherein the additional metal strips are not at edges of the slotted metal pad, and wherein the additional metal strips are not at a center of the slotted metal pad.

13. The die of claim 1, further comprising:
an interconnect structure formed over the slotted metal pad, wherein a portion of the interconnect structure directly on the slotted metal pad is planar.

14. The die of claim 1, wherein at least one microelectronic device is formed on the substrate.

15. The die of claim 1, wherein the dielectric bars have respective widths greater than about 0.4 μm.

16. The die of claim 1, wherein the substrate includes a semiconductor wafer, the TSV extending from a top major surface of the semiconductor wafer through to a bottom major surface of the semiconductor wafer.

17. The die of claim 1, wherein the slots between the plurality of metal bars are filled with a solid dielectric material.

18. A semiconductor die, comprising:
a through substrate via (TSV) formed in a substrate of the semiconductor die; and
a slotted metal pad formed directly over the TSV, wherein the slotted metal pad has a top surface area larger than a top surface area of the TSV, wherein the slotted metal pad has a plurality of metal bars in a first direction, and wherein slots between the plurality of metal bars are filled with a dielectric material to form dielectric bars, wherein a first metal bar of the plurality of metal bars at an edge of the slotted metal pad is wider than a second metal bar of the plurality of metal bars away from edges of the slotted metal pad.

19. A device comprising:
a semiconductor substrate having a top surface and a bottom surface;
a through substrate via (TSV) extending from the top surface of the semiconductor substrate, through the substrate, and to the bottom surface of the semiconductor substrate;
an external connector formed on the bottom surface of the semiconductor substrate and in physical contact with the TSV;
an interconnect structure formed over the top surface of the semiconductor substrate and in electrical contact with the TSV; and
a slotted metal pad formed directly over the TSV, wherein the slotted metal pad has a plurality of metal bars in a first direction, and wherein slots between the plurality of metal bars are filled with a solid dielectric material to form dielectric bars.

20. The device of claim 19, wherein the solid dielectric material is silicon oxide or a low dielectric constant (low-k) dielectric material.

* * * * *